(12) United States Patent
Furuse

(10) Patent No.: US 10,374,108 B2
(45) Date of Patent: Aug. 6, 2019

(54) PHOTOVOLTAIC DEVICE, PHOTOVOLTAIC MODULE, AND METHOD FOR FABRICATING THE PHOTOVOLTAIC DEVICE

(71) Applicant: PANASONIC INTELLECTUAL PROPERTY MANAGEMENT CO., LTD., Osaka (JP)

(72) Inventor: Shinichiro Furuse, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 15/702,508

(22) Filed: Sep. 12, 2017

(65) Prior Publication Data
US 2018/0006168 A1 Jan. 4, 2018

Related U.S. Application Data

(63) Continuation of application No. PCT/JP2016/000903, filed on Feb. 19, 2016.

(30) Foreign Application Priority Data

Mar. 31, 2015 (JP) ................. 2015-073128

(51) Int. Cl.
| | | |
|---|---|---|
| H01L 31/0236 | (2006.01) | |
| H01L 31/0747 | (2012.01) | |
| H01L 31/0376 | (2006.01) | |
| H01L 31/048 | (2014.01) | |
| H01L 31/20 | (2006.01) | |
| H01L 31/02 | (2006.01) | |

(52) U.S. Cl.
CPC .. *H01L 31/02363* (2013.01); *H01L 31/03762* (2013.01); *H01L 31/0488* (2013.01);
(Continued)

(58) Field of Classification Search
CPC ............ H01L 31/02363; H01L 31/202; H01L 31/0747; H01L 31/0488; H01L 31/03762; H01L 31/0481; H01L 31/0201
See application file for complete search history.

(56) References Cited

U.S. PATENT DOCUMENTS

| | | |
|---|---|---|
| 6,207,890 B1 | 3/2001 | Nakai et al. |
| 2001/0029978 A1 | 10/2001 | Nakai et al. |

(Continued)

FOREIGN PATENT DOCUMENTS

| | | |
|---|---|---|
| JP | 3271990 B2 | 4/2002 |
| JP | 2007-141967 A | 6/2007 |

(Continued)

OTHER PUBLICATIONS

Olibet, Properties of interfaces in amorphous / crystalline silicon heterojunctions, These presentee a la Faculte des Sciences Institut de Microtechnique Universite de Neuchatel, Universite de Neuchatel 2009, pp. 1-239, (Year: 2009).*

(Continued)

*Primary Examiner* — Devina Pillay
(74) *Attorney, Agent, or Firm* — McDermott Will & Emery LLP

(57) ABSTRACT

A photovoltaic device includes: a silicon substrate having a front surface having a texture; and an amorphous silicon layer having an uneven surface corresponding to the texture, wherein the amorphous silicon layer is amorphous in peak portions and slope portions extending between the peak portions and valley portions of the uneven surface, and has crystalline regions which grow, in a pillar manner, approximately perpendicularly from a substrate surface of the silicon substrate in the valley portions, the crystalline regions being discretely present along upper ends of the valley portions, the upper ends being opposite lower ends of the valley portions, the lower ends being in contact with the (Continued)

silicon substrate, wherein coverage of the crystalline regions in the valley portions is higher than coverage of amorphous regions in the valley portions.

8 Claims, 7 Drawing Sheets

(52) U.S. Cl.
CPC ........ *H01L 31/0747* (2013.01); *H01L 31/202* (2013.01); *H01L 31/0201* (2013.01); *H01L 31/0481* (2013.01); *Y02E 10/548* (2013.01); *Y02P 70/521* (2015.11)

(56) References Cited

U.S. PATENT DOCUMENTS

2011/0277817 A1\* 11/2011 Ide .................. H01L 31/022441
      136/246
2013/0244369 A1   9/2013 Nishimoto et al.
2015/0214394 A1\* 7/2015 Huang .............. H01L 31/02363
      136/255
2015/0372166 A1   12/2015 Tsunomura et al.

FOREIGN PATENT DOCUMENTS

| JP | 2015-053398 A | 3/2015 |
| WO | 2012/150627 A1 | 11/2012 |
| WO | 2014/155833 A1 | 10/2014 |

OTHER PUBLICATIONS

International Search Report and Written Opinion issued in International Patent Application No. PCT/JP2016/000903 dated Apr. 19, 2016; with partial English translation.

\* cited by examiner

PHOTOVOLTAIC DEVICE, PHOTOVOLTAIC MODULE, AND METHOD FOR FABRICATING THE PHOTOVOLTAIC DEVICE

CROSS REFERENCE TO RELATED APPLICATIONS

This application is a U.S. continuation application of PCT International Patent Application Number PCT/JP2016/000903 filed on Feb. 19, 2016, claiming the benefit of priority of Japanese Patent Application Number 2015-073128 filed on Mar. 31, 2015, the entire contents of which are hereby incorporated by reference.

BACKGROUND

1. Technical Field

The present disclosure relates to a photovoltaic device, a photovoltaic module, and a method for fabricating the photovoltaic device.

2. Description of the Related Art

A photovoltaic device having a light-receiving surface that is uneven, which is called a texture in which pyramids are two-dimensionally disposed, is known to reduce reflected light and increase an amount of light which enters the device, and thereby enhance the power generation efficiency of the photovoltaic device.

International publication No. 2014/155833 discloses a solar cell which includes a silicon substrate having a textured surface, and an amorphous silicon layer on the surface of the silicon substrate, wherein, in a cross-sectional view, epitaxially-grown regions in valley portions of the amorphous silicon layer are greater in thickness than epitaxially-grown regions in portions other than the valley portions of the amorphous silicon layer.

SUMMARY

An epitaxially-grown region is excellent in conductivity, as compared to an amorphous region which is a principal element of an amorphous silicon layer. Thus, the greater the coverage of the epitaxially-grown region in the amorphous silicon layer, the further the resistive losses are reduced and the fill factor (FF) is improved. Note that, also in the relationship between a crystalline region and the amorphous region, the greater the coverage of the crystalline region, the further the fill factor (FF) is improved, as with the above relationship between the epitaxially-grown region and the amorphous region.

However, an increase of the coverage of the crystalline region in the amorphous silicon layer results in reduction of open-circuit voltage (Voc). The crystalline region grows starting from a valley portion of the amorphous silicon layer. Thus, in order to optimize both the fill factor (FF) and the open-circuit voltage (Voc), it is important to optimize the coverage of crystalline regions in valley portions of the amorphous silicon layer.

Thus, an object of the present disclosure is to solve the above problem and provide a photovoltaic device, a photovoltaic module, and a method for fabricating the photovoltaic device which have a fill factor (FF) and an open-circuit voltage (Voc) both optimized.

In order to solve the above problem, a photovoltaic device according to the present disclosure includes a silicon substrate having a first major surface having a texture in which a plurality of pyramids are arrayed two-dimensionally; and a first amorphous silicon layer on the first major surface of the silicon substrate, the first amorphous silicon layer having an uneven surface corresponding to the texture, wherein the first amorphous silicon layer: is amorphous in peak portions and slope portions extending between the peak portions and valley portions of the uneven surface; and has crystalline regions which grow, in a pillar manner, approximately perpendicularly from a substrate surface of the silicon substrate in the valley portions of the uneven surface, the crystalline regions being discretely present along upper ends of the valley portions, the upper ends being opposite lower ends of the valley portions, the lower ends being in contact with the silicon substrate, wherein in a cross-sectional view of the first amorphous silicon layer, coverage of the crystalline regions in the valley portions is higher than coverage of amorphous regions in the valley portions.

Moreover, a method for fabricating the photovoltaic device according to the present disclosure includes: etching a (100) plane of a silicon substrate to form, on a first major surface of the silicon substrate, a texture in which a plurality of pyramids are two-dimensionally arrayed; after the (100) plane of the silicon substrate is etched, isotropically etching the first major surface of the silicon substrate; after the first major surface of the silicon substrate is isotropically etched, surface treating the first major surface having the texture, by submerging the first major surface in a mixed solution of hydrofluoric acid and hydrogen peroxide; and forming, on the surface-treated first major surface, a first amorphous silicon layer having an uneven surface corresponding to the texture, by vapor deposition using a raw material gas containing silicon.

According to the photovoltaic device, the photovoltaic module, and the method for fabricating the photovoltaic device of the present disclosure, the photovoltaic device can be provided which has a fill factor (FF) and an open-circuit voltage (Voc) both optimized.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

Hereinafter, a photovoltaic device, a photovoltaic module, and a method for fabricating the photovoltaic device according to embodiments of the present disclosure are described, with reference to the accompanying drawings. The embodiments described below are each one illustration of the present disclosure. Thus, values, shapes, materials, components, arrangement and connection between the components, and steps shown in the following embodiments are merely illustrative and not intended to limit the present disclosure. Therefore, among the components in the embodiments below, components not recited in any one of the independent claims defining the most generic part of the inventive concept of the present disclosure are described as arbitrary components.

Figures are schematic views and do not necessarily strictly illustrate the present disclosure. In the figures, the same reference sign is used to refer to the same component.

A "front surface" of the photovoltaic device, as used herein, refers to a surface through which a great amount of light (above 50% to 100% of light enters the photovoltaic device) can enter the photovoltaic device, as compared to a "rear surface", which is a surface opposite the front surface, including a case where no light enters the photovoltaic device through the "rear surface" at all. A "front surface" of the photovoltaic module, as used herein, refers to a surface through which light facing the "front surface" of the photovoltaic device enters the photovoltaic module. The "rear surface" of the photovoltaic module, as used herein, refers to a surface opposite the front surface of the photovoltaic module. An expression, such as "a second member is provided on a first member," does not only mean that the first member and the second member are provided in direct contact with each other, unless otherwise limited. In other words, the expression encompasses cases where another member is present between the first member and the second member. Moreover, the expression "approximately" in, for example, "approximately the same," encompasses meanings "exactly the same" and "substantially the same."

[1. Configuration of Photovoltaic Module]

Figure 1:
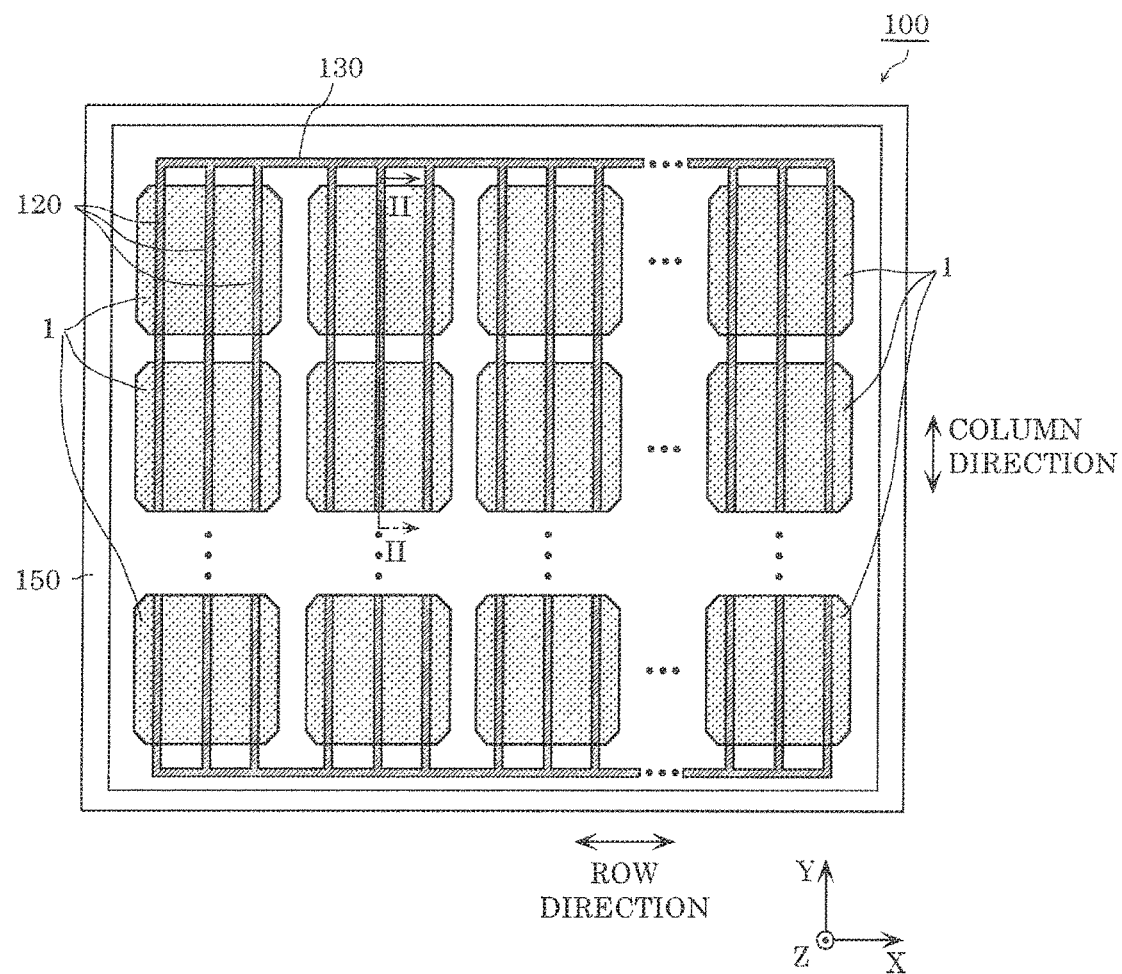
FIG. 1 is a general, plan view of a photovoltaic module according to an embodiment of the present disclosure.

An example of a planar configuration of the photovoltaic module according to the present embodiment is described, with reference to FIG. 1.

Figure 2:
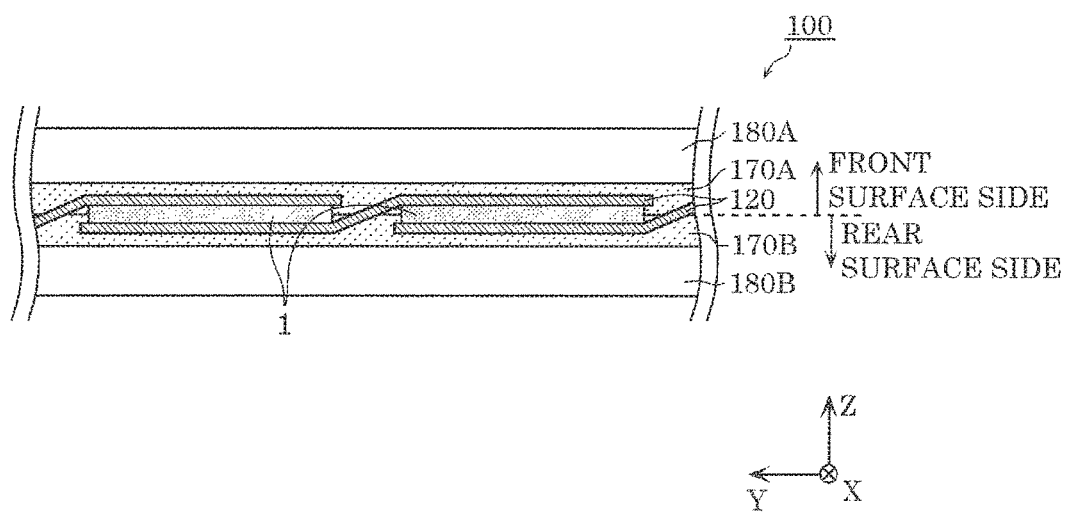
FIG. 2 is a cross-sectional view of a structure of the photovoltaic module according to the embodiment in a column direction.

FIG. 1 is a general, plan view of photovoltaic module 100 according to the embodiment. FIG. 2 is a cross-sectional view of a structure of photovoltaic module 100 according to the embodiment in a column direction. Specifically, FIG. 2 is a cross-sectional view of photovoltaic module 100 in FIG. 1, taken along a line II-II.

As illustrated in FIG. 1, photovoltaic module 100 includes photovoltaic devices 1, tab wires 120, crossing wire 130, and frame 150. As illustrated in FIG. 2, photovoltaic module 100 further includes front surface filler 170A, rear surface filler 170B, front surface shield 180A, and rear surface shield 180B.

Photovoltaic devices 1 are disposed two-dimensionally on a light-receiving surface of photovoltaic module 100. Photovoltaic devices 1 are planar photovoltaic cells which generate power when illuminated with light.

Tab wires 120 are disposed on the front surfaces of photovoltaic devices 1. Tab wires 120 are interconnect members which electrically connect photovoltaic devices 1 that are adjacent to each other in the column direction. Tab wires 120 are, for example, ribbon metal foils. For example, tab wires 120 can be fabricated by cutting a metal foil, the entirety of which is solder coated or silver coated, such as a copper foil or silver foil, into stripes having predetermined lengths.

Crossing wire 130 is an interconnect member which connects solar cell strings to each other. Note that the solar cell strings each refer to a collection of photovoltaic devices 1 that are disposed in the column direction and connected to each other by tab wire 120.

Frame 150 is an outer frame member which covers the outer periphery of a panel on which photovoltaic devices 1 are arrayed two dimensionally.

Moreover, a light diffuser may be disposed between adjacent photovoltaic devices 1. This allows light which enters spatial gaps between photovoltaic devices 1 to be re-distributed to photovoltaic devices 1, thereby improving light collection efficiency of photovoltaic devices 1. Thus, improvement of photoelectric conversion efficiency of the entirety of the photovoltaic module is achieved.

As illustrated in FIG. 2, in two photovoltaic devices 1 adjacent to each other in the column direction, tab wire 120 disposed on the front surface of one photovoltaic device 1 is disposed on the rear surface of the other photovoltaic device 1. More specifically, the lower surface of one end portion of tab wire 120 is joined to a busbar electrode on the front surface side of the one photovoltaic device 1, and the upper surface of the other end portion of tab wire 120 is joined to a busbar electrode on the rear surface side of the other photovoltaic devices 1.

Tab wires 120 and the busbar electrodes are joined by, for example, a conductive adhesive. Examples of the conductive adhesive include a conductive adhesive paste, a conductive adhesive film, and an anisotropic conductive film. The conductive adhesive paste is, for example, an adhesive in a paste in which conductive particles are scattered in a thermosetting adhesive resin material such as an epoxy resin, an acrylic resin, or a polyurethane resin. The conductive adhesive film and the anisotropic conductive film are formed in films in which conductive particles are scattered in thermosetting adhesive resin materials.

Note that the above conductive adhesive may be a solder material. Moreover, a resin adhesive not containing conductive particles may be employed, instead of the conductive adhesive. In this case, by designing a coating thickness of the resin adhesive as appropriate allows the resin adhesive to be softened upon application of pressure on the busbar electrodes and tab wire 120 during thermocompression bonding, thereby causing the busbar electrodes and tab wire 120 to be in direct contact and electrically connected to each other.

Moreover, as illustrated in FIG. 2, front surface shield 180A and rear surface shield 180B are disposed on the front surface side and the rear surface side, respectively, of photovoltaic devices 1. Front surface filler 170A is disposed between front surface shield 180A and a plane including photovoltaic devices 1. Rear surface filler 170B is disposed between rear surface shield 180B and the plane including photovoltaic devices 1. Front surface shield 180A and rear surface shield 180B are secured by front surface filler 170A and rear surface filler 170B, respectively.

Front surface shield 180A is a light-transmissive substrate which protects the front surface side of photovoltaic module 100. Front surface shield 180A protects an interior (photovoltaic devices 1, for example) of photovoltaic module 100 from external environment such as weather damage, external impact, fire, etc. Front surface shield 180A is a light-transmissive member, for example, a glass substrate (transparent glass substrate) which includes a transparent glass material, or a resin substrate which includes a rigid resin material in a film or plate which has light-transmittance and water barrier properties.

Rear surface shield 180B protects the rear surface of photovoltaic module 100 from external environment. For example, a resin film such as polyethylene terephthalate (PET), or a laminate film having a configuration in which an Al foil is sandwiched between resin films may be employed as rear surface shield 180B.

Front surface filler 170A and rear surface filler 170B have sealing functions for shielding photovoltaic devices 1 from external environment. Owing to the arrangement of front surface filler 170A and rear surface filler 170B, high heat resistance and high moisture resistance of photovoltaic module 100, which is envisaged to be installed outdoors, are secured.

Front surface filler 170A and rear surface filler 170B include light-transmissive polymeric materials which have the sealing functions. Examples of the polymeric material in front surface filler 170A include a light-transmissive resin material such as ethylene vinyl acetate (EVA).

From the standpoints of simplification of the manufacturing process and adhesion at an interface between front surface filler 170A and rear surface filler 170B among others, front surface filler 170A and rear surface filler 170B may be from the same material system.

[2. Structure of Photovoltaic Device]

A structure of photovoltaic devices 1 which are principal elements of photovoltaic module 100 is described.

Figure 3:
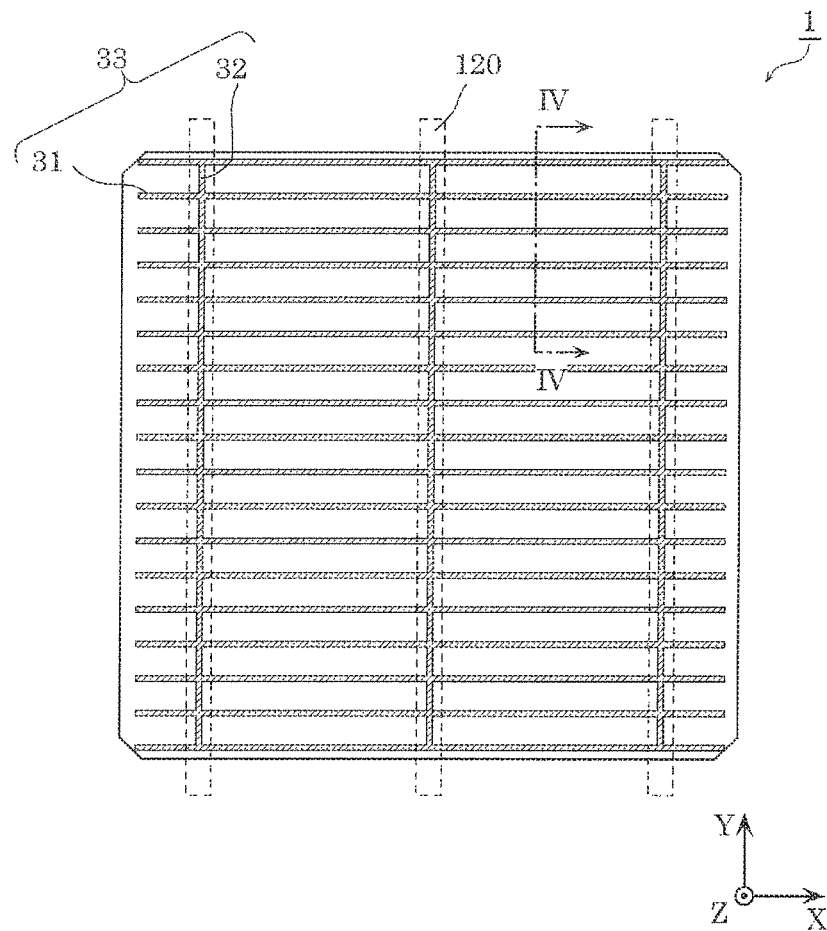
FIG. 3 is a plan view of a photovoltaic device according to the embodiment.

FIG. 3 is a plan view of photovoltaic device 1 according to the embodiment. As illustrated in the figure, photovoltaic device 1 is in an approximately square shape in a plan view. Dimensions of photovoltaic devices 1 are, for example, 125 mm long by 125 mm wide by 200 μm thick. On the front surfaces of photovoltaic devices 1, busbar electrodes 32 in stripes are formed in parallel with each other, and finger electrodes 31 in stripes are formed in parallel with each other so as to be perpendicular to busbar electrodes 32. Busbar electrodes 32 and finger electrodes 31 constitute collector electrode 33. Collector electrode 33 is formed using, for example, a conductive paste containing conductive particles such as Ag (silver). Busbar electrodes 32 have line widths of, for example, 1.5 mm. Finger electrodes 31 have line widths of, for example, 100 μm. The pitches between finger electrodes 31 are, for example, 2 mm. Moreover, tab wires 120 are joined on busbar electrodes 32.

Figure 4:
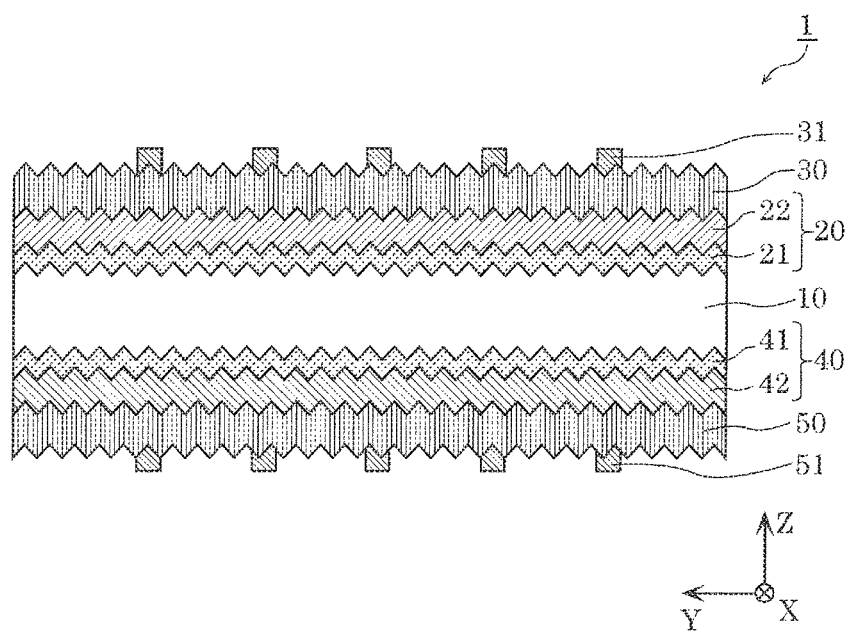
FIG. 4 is a schematic, cross-sectional view showing a layered structure of the photovoltaic device according to the embodiment.

FIG. 4 is a schematic, cross-sectional view illustrating a layered structure of photovoltaic device 1 according to the embodiment. Note that the figure is a cross-sectional view of photovoltaic device 1 in FIG. 3, taken along a line IV-IV. As illustrated in FIG. 4, photovoltaic devices 1 each include silicon substrate 10, amorphous silicon layers 20 and 40, transparent electrodes 30 and 50, and finger electrodes 31 and 51. Note that only finger electrodes 31 in collector electrode 33 are shown in FIG. 4.

A first major surface and a second major surface, which are opposing surfaces of silicon substrate 10, each have a texture in which pyramids are disposed two-dimensionally. Silicon substrate 10 is an n-type monocrystalline silicon substrate. Note that silicon substrate 10 may be formed using poly-crystalline silicon.

Amorphous silicon layer 20 is a first amorphous silicon layer which is disposed on the first major surface of silicon substrate 10, has an uneven surface corresponding to the texture of silicon substrate 10, and is substantially amorphous other than in portions of valley portions of the uneven surface. Amorphous silicon layer 20 includes dielectric film 21 and n-type amorphous silicon film 22.

Dielectric film 21 is a first dielectric film formed on the first major surface of silicon substrate 10. Dielectric film 21 is, for example, an intrinsic amorphous silicon semiconductor thin film which contains hydrogen. Here, the intrinsic semiconductor thin film refers to a semiconductor thin film having a concentration of a p-type or n-type dopant of $5\times10^{18}/cm^3$ or less. If both the p-type dopant and the n-type dopant are contained, the intrinsic semiconductor thin film refers to a semiconductor thin film whose difference in concentration between the p-type dopant and the n-type dopant is $5\times10^{18}/cm^3$ or less. Preferably, dielectric film 21 is sufficiently thin to minimize absorption of light, while having a thickness to an extent that allows sufficient passivation of the front surface of silicon substrate 10. Dielectric film 21 has a thickness of, for example, 1 nm or greater and 25 nm or less, and, preferably, 5 nm or greater and 10 nm or less.

Note that dielectric film 21 may not be the intrinsic silicon semiconductor thin film as described above, and may be a silicon oxide film, a silicon nitride film, and an aluminum oxide film. Dielectric film 21 may be absent and n-type amorphous silicon film 22 may be formed directly on the first major surface of silicon substrate 10.

N-type amorphous silicon film 22 is a first amorphous silicon film which is formed on dielectric film 21, contains a dopant of n-type which is the same conductivity type as silicon substrate 10, and is substantially amorphous other than in the valley portions of the above uneven surface. N-type amorphous silicon film 22 is, for example, an amorphous silicon semiconductor thin film which contains hydrogen. Preferably, n-type amorphous silicon film 22 has an n-type dopant concentration higher than dielectric film 21, and the n-type dopant concentration of n-type amorphous silicon film 22 is $1\times10^{20}/cm^3$ or greater. The n-type dopant is, for example, phosphorus (P). Preferably, n-type amorphous silicon film 22 is sufficiently thin to minimize absorption of light, while having a thickness to an extent that allows carriers generated within silicon substrate 10 to be separated effectively, and collected efficiently at transparent electrode 30.

Amorphous silicon layer 40 is a second amorphous silicon layer which is disposed on the second major surface of silicon substrate 10, has the uneven surface corresponding to the texture of silicon substrate 10, and is substantially amorphous other than in the valley portions of the uneven surface. Amorphous silicon layer 40 includes dielectric film 41 and p-type amorphous silicon film 42.

Dielectric film 41 is a second dielectric film formed on the second major surface of silicon substrate 10. Dielectric film 41 is, for example, an intrinsic amorphous silicon semiconductor thin film which contains hydrogen. Dielectric film 41 has, for example, the same thickness as the thickness of dielectric film 21, which is 1 nm or greater and 25 nm or less, and, preferably, 5 nm or greater and 10 nm or less.

Note that dielectric film 41 may not be the intrinsic silicon semiconductor thin film as described above, and may be a silicon oxide film, a silicon nitride film, and an aluminum oxide film. Dielectric film 41 may be absent and p-type amorphous silicon film 42 may be formed directly on the second major surface of silicon substrate 10.

P-type amorphous silicon film 42 is a second amorphous silicon film which is formed on dielectric film 41, contains a dopant of p-type which is a conductivity type opposite the conductivity type of silicon substrate 10, and is substantially amorphous other than in the valley portions of the above uneven surface. P-type amorphous silicon film 42 is, for example, an amorphous silicon semiconductor thin film which contains hydrogen. Preferably, p-type amorphous silicon film 42 has a p-type dopant concentration higher than dielectric film 41, and the p-type dopant concentration of p-type amorphous silicon film 42 is $1 \times 10^{20}/cm^3$ or greater. The p-type dopant is, for example, boron (B). Preferably, p-type amorphous silicon film 42 is sufficiently thin to minimize absorption of light, while having a thickness to an extent that allows carriers generated within silicon substrate 10 to be separated effectively, and collected efficiently at transparent electrode 50.

Transparent electrode 30 is formed on amorphous silicon layer 20 and collects carriers within n-type amorphous silicon film 22. Transparent electrode 50 is formed on amorphous silicon layer 40 and collects carriers within p-type amorphous silicon film 42. Transparent electrodes 30 and 50 are formed using, for example, transparent conductive oxide, such as indium tin oxide (ITO).

Note that whether the first major surface side of silicon substrate 10 is the light-receiving surface of photovoltaic device 1 (surface through which primarily external light is introduced) or whether the second major surface side is the light-receiving surface is arbitrary.

The conductivity type of silicon substrate 10 is n type in the present embodiment. However, the conductivity type of silicon substrate 10 may be p type. In this case, p-type amorphous silicon film 42 included in amorphous silicon layer 40 has the same conductivity type as silicon substrate 10, and amorphous silicon layer 40 is thus the first amorphous silicon layer. Moreover, n-type amorphous silicon film 22 included in amorphous silicon layer 20 has a conductivity type opposite the conductivity type of silicon substrate 10, and amorphous silicon layer 20 is thus the second amorphous silicon layer.

While photovoltaic devices 1 according to the present embodiment are bifacial photovoltaic devices in which transparent electrode 50 is disposed on the second major surface side of silicon substrate 10, photovoltaic devices 1 may be monofacial photovoltaic devices in which transparent electrode 50 is a non-transparent metal electrode.

[2-1. Structure of Front Surface of Silicon Substrate]

Next, the texture of silicon substrate 10 is described.

Figure 5A:
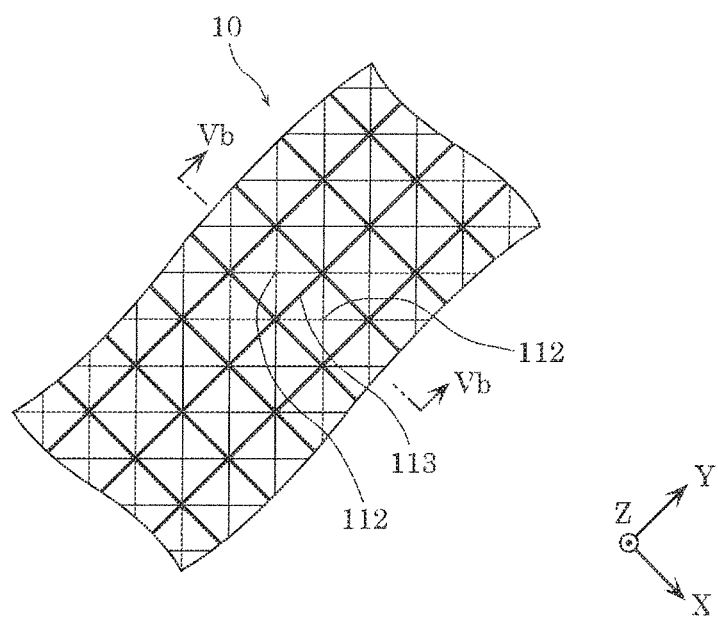
FIG. 5A is a magnified plan, schematic view of a texture of a first major surface of a silicon substrate according to the embodiment.
Figure 5B:
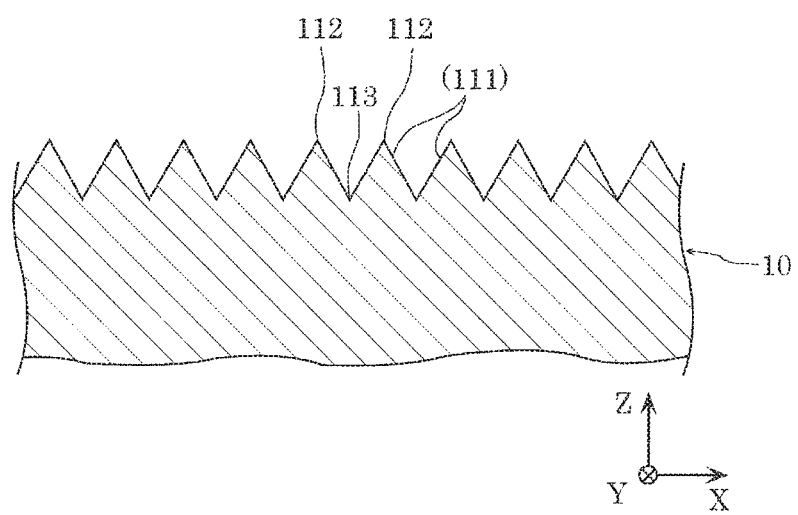
FIG. 5B is a magnified schematic, cross-sectional view of the texture of the first major surface of the silicon substrate according to the embodiment.

FIGS. 5A and 5B are a magnified plan, schematic view and a magnified schematic, cross-sectional view, respectively, of the texture of the first major surface of silicon substrate 10 according to the embodiment. Note that FIG. 5B is a cross-sectional view of the first major surface of silicon substrate 10 in FIG. 5A, taken along a line Vb-Vb.

As illustrated in FIG. 5A, the front surface of silicon substrate 10 has the texture in which pyramids are disposed two-dimensionally. As illustrated in FIG. 5B, the texture has substrate peak portions 112 of the pyramids and substrate valley portions 113 lying between adjacent substrate peak portions 112. In the present embodiment, the surfaces of the pyramids between substrate peak portions 112 and substrate valley portions 113 are (111) planes of silicon crystal.

Heights from substrate valley portions 113 to substrate peak portions 112 are, for example, 1 to 10 μm. Spacing between adjacent substrate peak portions 112 is, for example, 1 to 10 μm.

While the heights of substrate peak portions 112 and substrate valley portions 113 and pitches between substrate peak portions 112 and substrate valley portions 113 in the texture of silicon substrate 10 according to the present embodiment are at random, it should be noted that they may be regular.

Moreover, while the texture is formed on the second major surface of silicon substrate 10 of the present embodiment, the texture may not be formed on the second major surface side.

[2-2. Structure of Amorphous Silicon Layer]

Figure 6A:
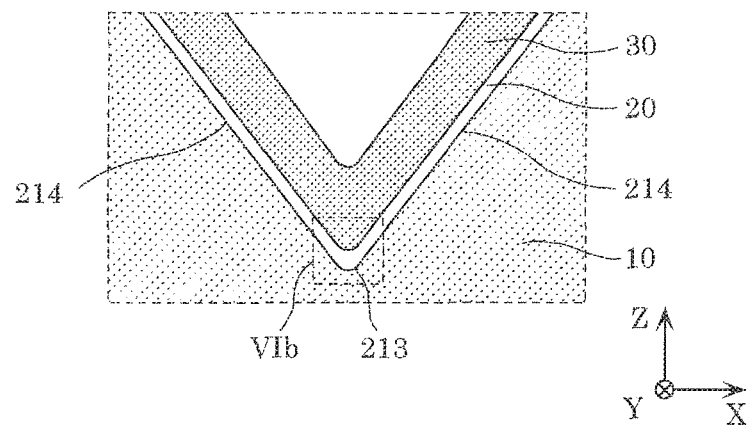
FIG. 6A is a magnified cross-sectional view of the photovoltaic device according to the embodiment.

FIG. 6A is a magnified cross-sectional view of the photovoltaic device according to the embodiment. Specifically, FIG. 6A is a magnified cross-sectional view of a layered structure which includes silicon substrate 10, amorphous silicon layer 20, and transparent electrode 30 in the vicinity of a valley portion, FIG. 6A being a cross-sectional view along a valley line. The cross-sectional view of FIG. 6A illustrates two slope portions 214 adjacent to each other and valley portion 213 lying therebetween of amorphous silicon layer 20, the slope portions 214 extending between peak portions 212 and valley portion 213. As illustrated in FIG. 6A, amorphous silicon layer 20 has the uneven surface corresponding to the texture of the front surface of silicon substrate 10, and transparent electrode 30 also has the uneven surface corresponding to the texture.

Here, in the cross-sectional view of photovoltaic device 1 (view in Y-axis direction) as illustrated in FIG. 6A, amorphous silicon layer 20 has a round shape (radiused) in valley portions 213. This shape corresponds to radiused substrate valley portions 113 of silicon substrate 10. The front surfaces of substrate valley portions 113 include (100) planes of silicon crystal.

Figure 6B:
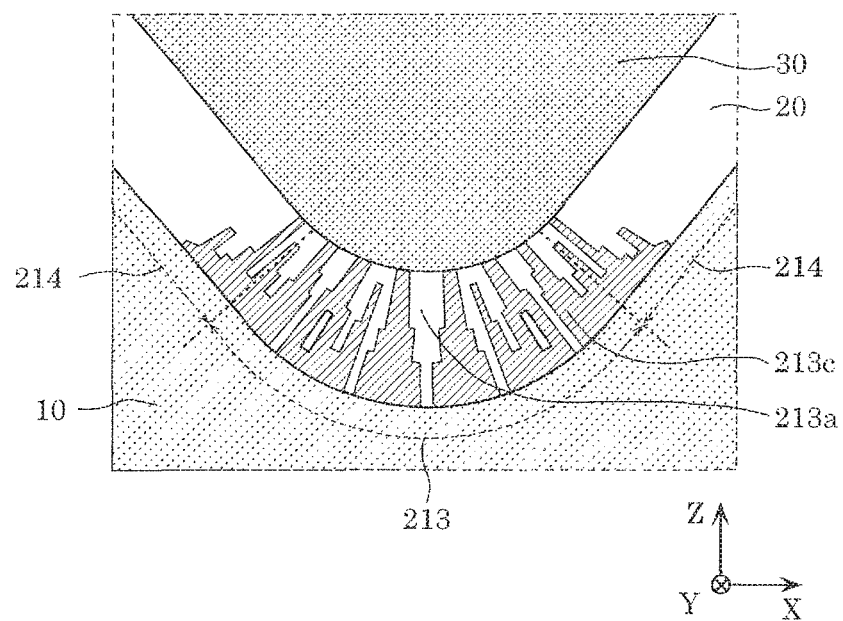
FIG. 6B is a magnified cross-sectional view of a valley portion of an amorphous silicon layer according to the embodiment and its periphery.

FIG. 6B is a magnified cross-sectional view of valley portion 213 of amorphous silicon layer 20 according to the embodiment and its periphery. Specifically, FIG. 6B is a magnified cross-sectional view of region VIb of valley portion 213 of amorphous silicon layer 20 illustrated in FIG. 6A.

As illustrated in FIG. 6B, amorphous silicon layer 20 has crystalline regions 213c and amorphous regions 213a in valley portions 213. On the other hand, peak portions 212 (not shown) and slope portions 214 lying between peak portions 212 and valley portions 213 of amorphous silicon layer 20, other than boundaries between valley portions 213 and slope portions 214, are substantially non-crystalline. Note that crystalline regions 213c may include, for example, an epitaxial region reflective of a crystal orientation of silicon substrate 10, and microscopic crystalline regions. Amorphous regions 213a are occupied with non-crystalline silicone and not reflective of the crystal orientation of the silicon substrate.

In photovoltaic device 1 according to the present embodiment, crystalline regions 213c are scattered approximately across valley portions 213. Crystalline regions 213c in valley portions 213 grow, in a pillar manner, approximately perpendicularly from the substrate surface of silicon substrate 10, and are discretely present (in approximately X-axis direction) along upper ends of valley portions 213, the upper ends being opposite lower ends of valley portions 213, the lower ends being in contact with silicon substrate 10. A feature of photovoltaic device 1 is that in a cross-sectional view of amorphous silicon layer 20, coverage of crystalline regions 213c in the valley portion 213 areas is higher than coverage of amorphous regions 213a in the valley portion 213 areas. Note that the coverage refers to the area of the crystalline regions or the area of amorphous regions as a percentage of the area of the valley portion areas of the amorphous silicon layer in the cross-sectional view of photovoltaic devices 1. The "pillar" crystalline regions 213c mentioned above may not extend through transparent electrode 30 disposed above amorphous silicon layer 20, may be connected (continuous) to each other on the substrate surface, or may have voids.

The crystalline regions are excellent in conductivity, as compared to the amorphous regions which are principal elements of amorphous silicon layer 20. Thus, the greater the coverage of the crystalline regions in amorphous silicon layer 20, the further the resistive losses are reduced and the fill factor (FF) is improved.

However, if the coverage of the crystalline regions in amorphous silicon layer 20 is too high, reduction of open-circuit voltage (Voc) results. The crystalline regions grow starting from valley portions 213 of amorphous silicon layer 20. Thus, in order to optimize both the fill factor (FF) and the open-circuit voltage (Voc), it is important to optimize the coverage of crystalline regions 213c in valley portions 213 of amorphous silicon layer 20.

In a cross-sectional view of amorphous silicon layer 20 in photovoltaic device 1 according to the present embodiment, the coverage of crystalline regions 213c in the valley portion 213 areas is higher than the coverage of amorphous regions 213a in the valley portion 213 areas. This allows reduction of the resistive losses in amorphous silicon layer 20 and improvement of the fill factor (FF) of photovoltaic device 1, as compared to the amorphous silicon layer in which amorphous regions 213a are dominant in valley portions 213. Moreover, the fact that crystalline regions 213c are formed in the pillar manner, extending from the lower ends to the upper ends of valley portions 213, is advantageous for the fill factor (FF) in terms of securing a current path in a direction perpendicular to the film surface.

On the other hand, crystalline regions 213c in valley portions 213 grow in a pillar manner from the lower ends to the upper ends of valley portions 213 and are discretely present along the upper ends. Thus, amorphous regions 213a and crystalline regions 213c are scattered and mixed in valley portions 213. Owing to this, the open-circuit voltage (Voc) of photovoltaic device 1 can be inhibited, while maintaining amorphous silicon layer 20 to a low resistance state, as compared to an amorphous silicon layer in which valley portions 213 are fully occupied with crystalline regions 213c.

Next, a range of valley portions 213 in amorphous silicon layer 20 is described.

Figure 7:
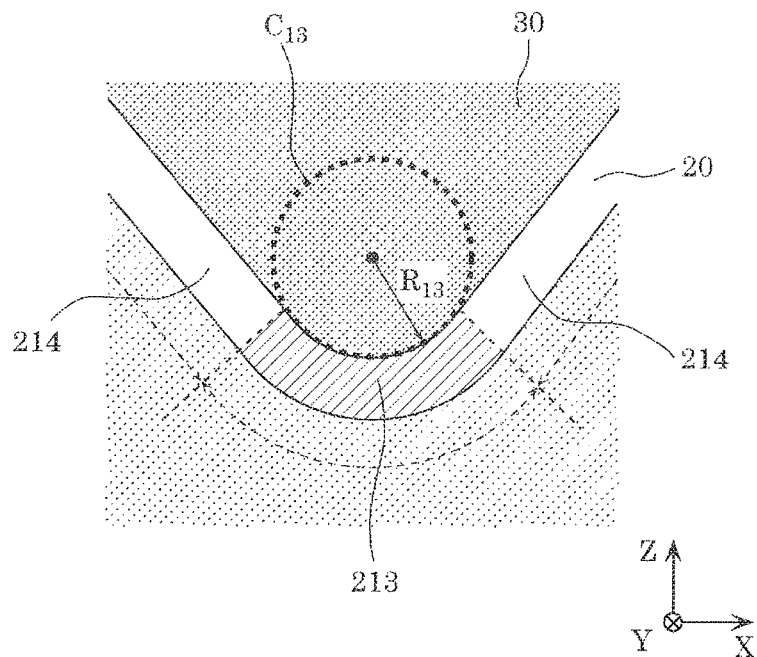
FIG. 7 is a diagram illustrating a radius of curvature representing a radiused valley portion of the amorphous silicon layer according to the embodiment.

FIG. 7 is a diagram illustrating a radius of curvature representing radiused valley portion 213 of amorphous silicon layer 20 according to the embodiment. As described above, in a cross-sectional view (view in Y-axis direction) of photovoltaic device 1, valley portions 213 are radiused in correspondence with the shapes of substrate valley portions 113 of silicon substrate 10. Valley portions 213 are lying between approximately-straight slope portions 214. Here, the range of valley portions 213 is defined by two points at which angles of slope portions 214 change, as illustrated in FIG. 7.

Here, radius of curvature $R_{13}$ of valley portion 213 illustrated in FIG. 7 is 150 nm or less. Since cross-sectional shapes of valley portions 213 are radiused, each having radius of curvature $R_{13}$ of 150 nm or less, selective crystal growth in valley portions 213 is allowed. Moreover, preferably, radii of curvature $R_{13}$ of valley portions 213 is 100 nm or less, and, more preferably, 1 to 50 nm or less. Note that radius of curvature $R_{13}$ of each valley portion 213 is defined as a radius of circle $C_{13}$ encompassing the two points mentioned above and a surface of the valley portion between the two points.

While the range of valley portions 213 according to the present embodiment is defined as an area within a circular arc having a predetermined radius of curvature as described above, it should be noted that the range may be defined by an angle described below.

Figure 8:
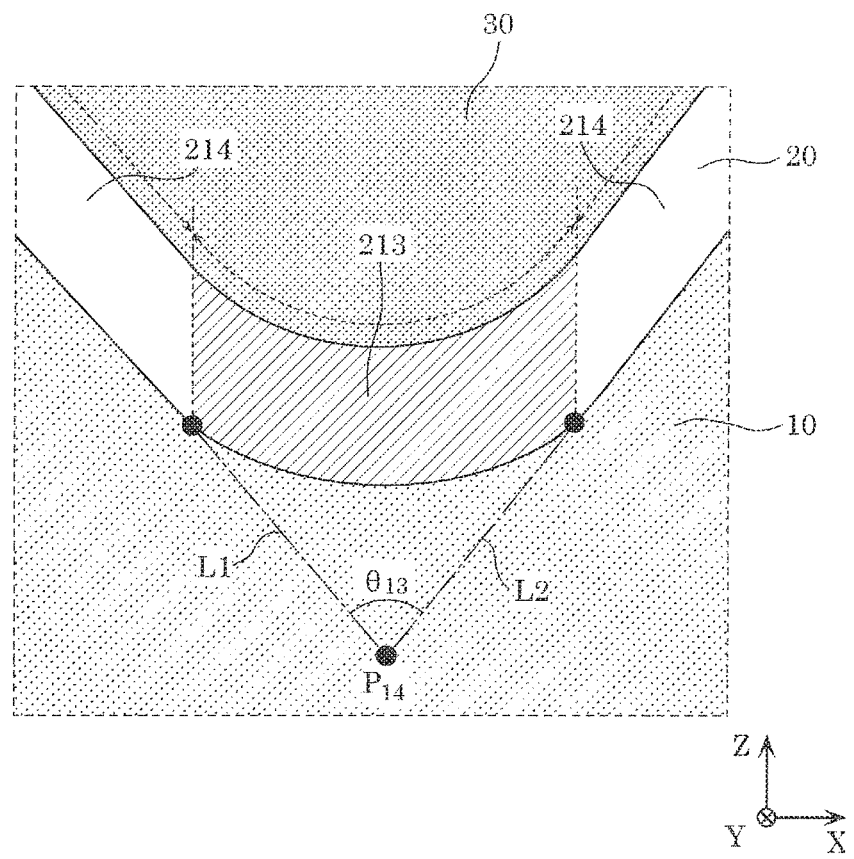
FIG. 8 is a diagram illustrating an angle representing the radiused valley portion of the amorphous silicon layer according to the embodiment.

FIG. 8 is a diagram illustrating an angle representing radiused valley portion 213 of amorphous silicon layer 20 according to the embodiment. As described above, valley portions 213 are radiused in correspondence with the shapes of substrate valley portions 113 of silicon substrate 10 in a cross-sectional view of photovoltaic device 1 (view in Y-axis direction). Valley portions 213 are areas lying between approximately-straight slope portions 214. Here, point of intersection $P_{14}$ between lines L1 and L2 extending along respective interfaces between silicon substrate 10 and two slope portions 214 sandwiching valley portion 213 is defined. In this case, the range of valley portion 213 is defined by an angle extending upward (positive Z-axis direction) from the vertex, namely, point of intersection $P_{14}$ toward valley portion 213, as illustrated in FIG. 8. The angle is 60 degrees or less.

In valley portion 213 defined by the angle as described above, crystalline regions 213c grow, in a pillar manner, approximately perpendicularly from the substrate surface of silicon substrate 10 and are discretely present along the upper ends of valley portions 213, and the coverage of crystalline regions 213c in the valley portion 213 area is higher than the coverage of amorphous regions 213a in the valley portion 213 area. This allows the fill factor (FF) to be improved, while inhibiting reduction of the open-circuit voltage (Voc) of photovoltaic devices 1. Thus, improvement of power generation efficiency of photovoltaic devices 1 is achieved.

[3. Method for Fabricating Photovoltaic Device]

Next, a method for fabricating photovoltaic device 1 which includes amorphous silicon layer 20 having the feature as set forth above is described.

Figure 9:
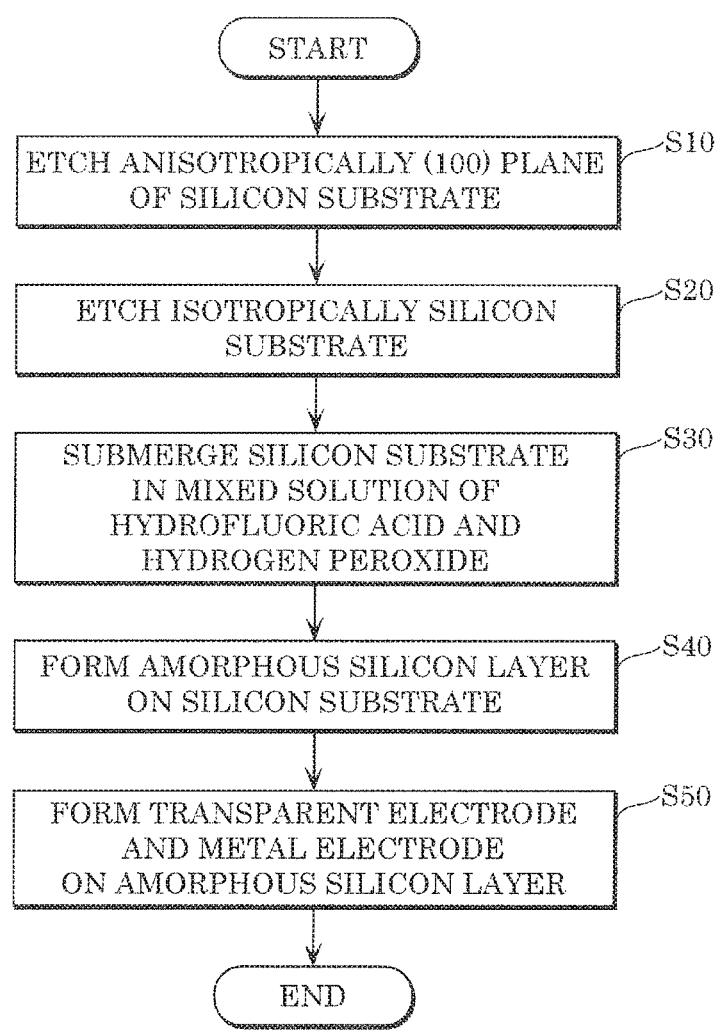
FIG. 9 is a flowchart illustrating a procedure of a method for fabricating the photovoltaic device according to the embodiment.

FIG. 9 is a flowchart illustrating a procedure of a method for fabricating photovoltaic device 1 according to the embodiment.

Initially, a (100) plane of silicon substrate 10 is etched anisotropically (S10: etching process). This forms a texture, in which pyramids are two-dimensionally arrayed, on the first major surface and the second major surface of silicon substrate 10.

Specifically, silicon substrate 10 having the (100) plane is submerged in etchant. The etchant includes an alkaline aqueous solution. Examples of the alkaline aqueous solution include an alkaline aqueous solution which contains at least one of sodium hydroxide (NaOH), potassium hydroxide (KOH), and tetramethylammonium hydroxide (TMAH). Submerging the (100) plane of silicon substrate 10 in the above alkaline aqueous solution anisotropically etches the front surface and the rear surface of the silicon substrate along a (111) plane. As a result, the texture, in which pyramids having substrate peak portions 112 and substrate valley portions 113 are arrayed two-dimensionally, is formed on the front surface and the rear surface of silicon substrate 10, as illustrated in FIGS. 5A and 5B. The pyramidal surfaces of the pyramids are the (111) plane. Note that the concentration of the alkaline aqueous solution in the etchant is, for example, 0.1 to 10 wt %.

Next, silicon substrate 10 having the above texture is etched isotropically (S20). This processes substrate valley portions 113 to be radiused (see FIGS. 6A and 6B). For this process, specifically, wet etching using a mixed solution of hydrofluoric acid (HF) and nitric acid ($HNO_3$) or a mixed solution of hydrofluoric acid (HF), nitric acid ($HNO_3$), and acetic acid ($CH_3COOH$), or dry etching using a gas mixture of tetrafluoromethane ($CF_4$) and oxygen ($O_2$) is applicable. Moreover, radii of curvature of substrate valley portions 113 can be adjusted by controlling, for example, the mixture ratio between the above materials and the processing time. Moreover, substrate peak portions 112 or ridge portions of the texture may be rounded by this process.

Next, silicon substrate 10 subjected to the above isotropically etching process is submerged in a mixed solution of hydrofluoric acid (HF) and hydrogen peroxide ($H_2O_2$) (S30: surface treatment process). This process employs the mixed solution of hydrofluoric acid and hydrogen peroxide to selectively modify the front surfaces of radiused substrate valley portions 113. Note that, preferably, the concentration of hydrofluoric acid in the above mixed solution is 0.1 to 5 wt % and the concentration of hydrogen peroxide in the mixed solution is 0.1 to 5 wt %. More preferably, the concentration of hydrofluoric acid in the above mixed solution is 0.5 to 3 wt %, and the concentration of hydrogen peroxide ($H_2O_2$) in the mixed solution is 2 to 4 wt %.

Next, amorphous silicon layer 20 and amorphous silicon layer 40 are formed on the surface-treated first major surface and the surface-treated second major surface, respectively, of silicon substrate 10 (S40: silicon layer forming process). In silicon layer forming step S40, dielectric film 21, n-type amorphous silicon film 22, dielectric film 41, and p-type amorphous silicon film 42 are formed in the listed order. Note that the order of formation of the films is not limited thereto. For example, dielectric film 21 and dielectric film 41 may be formed simultaneously, followed by forming n-type amorphous silicon film 22 and p-type amorphous silicon film 42 in the listed order.

Initially, dielectric film 21 is formed on the front surface of silicon substrate 10 (S41). Dielectric film 21 is, for example, an intrinsic amorphous silicon semiconductor thin film, and is formed by plasma-enhanced chemical vapor deposition (PECVD), catalytic chemical vapor deposition (Cat-CVD), and a sputtering technique, for example. PECVD may be any technique such as RF plasma CVD method, VHF plasma CVD method which uses high frequency, microwave plasma CVD method, etc. In the present embodiment, dielectric film 21 is formed by RF plasma CVD method, for example. Specifically, a gas, in which a silicon-contained gas such as silane ($SiH_4$) is diluted with hydrogen, is supplied to a deposition chamber and RF high frequency power is applied to a parallel-plate electrode disposed in the deposition chamber, thereby turning the gas into plasma. The plasma gas is supplied to the front surface of silicon substrate 10 that is heated to 150 degrees Celsius or greater and 250 degrees Celsius or less and dielectric film 21 is thereby formed.

Next, n-type amorphous silicon film 22 is formed on dielectric film 21 (S42). N-type amorphous silicon film 22 is formed by PECVD, Cat-CVD, and a sputtering technique, for example. RF plasma CVD method is employed as the PECVD. Specifically, a gas mixture, in which a silicon-contained gas such as silane ($SiH_4$) and an n-type dopant-contained gas such as phosphine ($PH_3$) are diluted with hydrogen, is supplied to a deposition chamber and RF high frequency power is applied to a parallel-plate electrode disposed in the deposition chamber, thereby turning the gas mixture into plasma. Note that the concentration of phosphine ($PH_3$) in the gas mixture is, for example, 2%. The plasma gas is supplied to the front surface of silicon substrate 10 that is heated to 150 degrees Celsius or greater and 250 degrees Celsius or less and n-type amorphous silicon film 22 is thereby formed on dielectric film 21.

Next, dielectric film 41 is formed on the rear surface of silicon substrate 10 (S43). Dielectric film 41 is, for example, an intrinsic amorphous silicon semiconductor thin film, and is formed by PECVD, Cat-CVD, and a sputtering technique, for example. PECVD may be any technique such as RF plasma CVD method, VHF plasma CVD method which uses high frequency, microwave plasma CVD method, etc. In the present embodiment, dielectric film 41 is formed by RF plasma CVD method, for example. Specifically, a gas, in which a silicon-contained gas such as silane ($SiH_4$) is diluted with hydrogen, is supplied to a deposition chamber and RF high frequency power is applied to a parallel-plate electrode disposed in the deposition chamber, thereby turning the gas into plasma. The plasma gas is supplied to the front surface of silicon substrate 10 that is heated to 150 degrees Celsius or greater and 250 degrees Celsius or less and dielectric film 41 is thereby formed.

Next, p-type amorphous silicon film 42 is formed on dielectric film 41 (S44). P-type amorphous silicon film 42 is formed by PECVD, Cat-CVD, and a sputtering technique, for example. RF plasma CVD method is employed as the PECVD. Specifically, a gas mixture, in which a silicon-contained gas such as silane ($SiH_4$) and a p-type dopant-contained gas such as diborane ($B_2H_6$) are diluted with hydrogen, is supplied to a deposition chamber and RF high frequency power is applied to a parallel-plate electrode disposed in the deposition chamber, thereby turning the gas mixture into plasma. Note that the concentration of diborane ($B_2H_6$) in the gas mixture is, for example, 1%. The plasma gas is supplied to the front surface of silicon substrate 10 that is heated to 150 degrees Celsius or greater and 250 degrees Celsius or less and p-type amorphous silicon film 42 is thereby formed on dielectric film 41.

According to the above steps S41 to S44, amorphous silicon layer 20 and amorphous silicon layer 40 are formed on the front surface and the rear surface, respectively, of silicon substrate 10.

Last, transparent electrodes 30 and 50, and a metal electrode are formed on amorphous silicon layers 20 and 40 (S50). Initially, transparent electrode 30 is formed on n-type amorphous silicon film 22, and transparent electrode 50 is formed on p-type amorphous silicon film 42. Specifically, a transparent conductive oxide, such as indium tin oxide (ITO), is deposited on n-type amorphous silicon film 22 and p-type amorphous silicon film 42 by a deposition technique and a sputtering technique, for example. Next, collector electrode 33 (metal electrode), including finger electrodes 31, is formed on transparent electrode 30, and a collector electrode (metal electrode), including finger electrode 51, is formed on transparent electrode 50. The collector electrode can be formed by, for example, a printing method such as screen printing, using a thermosetting resin-type conductive paste which includes a resin material as a binder and conductive particles, such as silver particles, as a filler.

According to the above steps S10 to S50, photovoltaic device 1 according to the present embodiment is formed.

According to the above method for fabricating photovoltaic device 1, as illustrated in FIG. 6B, crystalline regions 213c in valley portions 213 grow, in a pillar manner, approximately perpendicularly from the substrate surface of silicon substrate 10, and are discretely present (in approximately X-axis direction) along upper ends of valley portions 213, the upper ends being opposite lower ends of valley portions 213, the lower ends being in contact with silicon substrate 10. In cross-sectional views of amorphous silicon layers 20 and 40, the coverage of crystalline regions 213c in the valley portion 213 areas is higher than the coverage of amorphous regions 213a in the valley portion 213 areas.

In the following, a cross-sectional structure of photovoltaic device 1 according to the present embodiment and a cross-sectional structure of a photovoltaic device according to Comparative Example are compared.

Figure 10A:
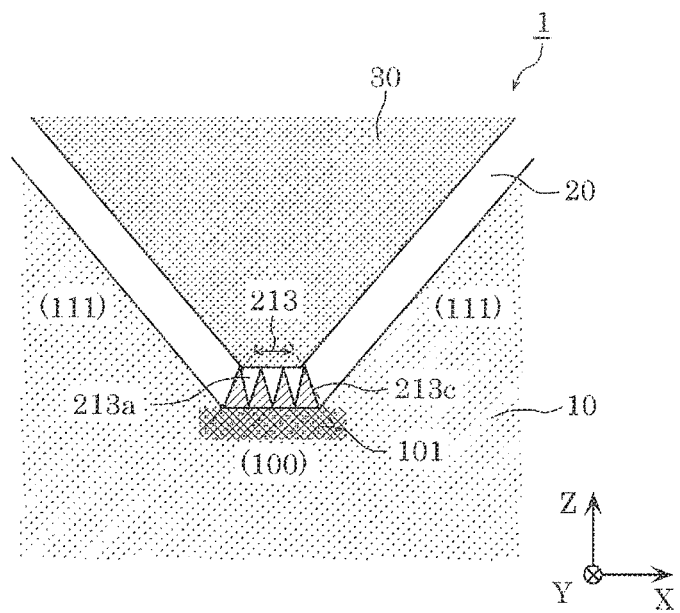
FIG. 10A is a schematic, cross-sectional view of a structure of the valley portions of the photovoltaic device according to the embodiment.
Figure 10B:
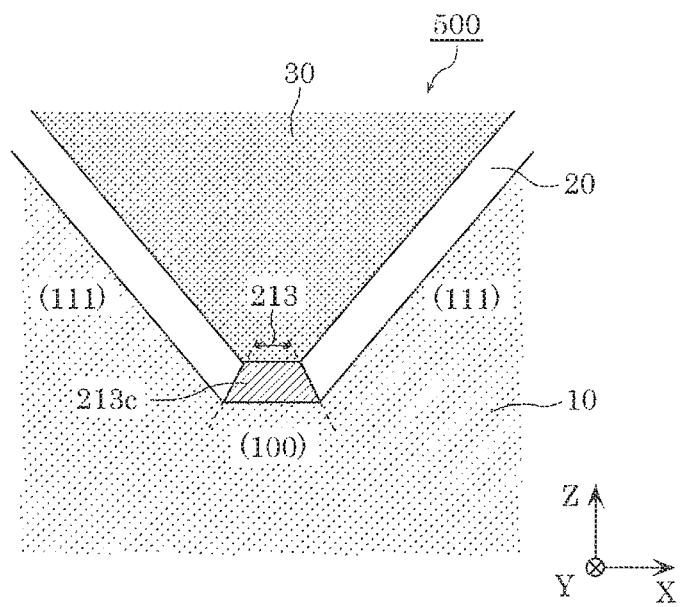
FIG. 10B is a schematic, cross-sectional view of a structure of the valley portions of a photovoltaic device according to Comparative Example.

FIG. 10A is a schematic, cross-sectional view of a structure of valley portion 213 of photovoltaic device 1 according to the embodiment. FIG. 10B is a schematic, cross-sectional view of a structure of a valley portion of the photovoltaic device according to Comparative Example.

In order to form a texture on the front surface of a silicon substrate of the photovoltaic device according to Comparative Example illustrated in FIG. 10B, hydrogen plasma treatments such as anisotropically etching, isotropically etching using hydrofluoric acid and nitric acid are carried out in order. This removes native oxide on the front surfaces of valley portions which include (111) planes. For this reason, although growth of the crystalline regions in valley portions 213 is facilitated, controlling of the coverage of crystalline regions in valley portions 213 is difficult. Thus, it is assumed that the crystalline regions are formed in almost the entirety of valley portion 213, as illustrated in FIG. 10B. In amorphous silicon layer 20, the crystalline regions grow starting from valley portions 213 of amorphous silicon layer 20. For this reason, if the entirety of valley portion 213 is occupied with the crystalline regions, the crystalline regions may spread even to slope portions 214, starting from valley portion 213. This causes reduction of the open-circuit voltage (Voc).

In contrast, in order to form the texture on the front surface of the silicon substrate in photovoltaic device 1 according to the present embodiment illustrated in FIG. 10A, the front surface is anisotropically etched, and then isotropically etched using a mixed solution of hydrofluoric acid and hydrogen peroxide, and the front surfaces of the valley portions which include (111) planes, are selectively surface treated.

Due to the surface modification treatment on substrate valley portions 113 of silicon substrate 10, crystallinity of valley portions 213 of amorphous silicon layer 20 according to the present embodiment is disturbed, as compared to the valley portion illustrated in FIG. 10B. Thus, as illustrated in FIG. 10A, crystalline regions 213c grow, in a pillar manner, approximately perpendicularly from the substrate surface of silicon substrate 10 and are discretely present (in approximately X-axis direction) along the upper ends of valley portions 213 which are opposite the lower ends in contact with silicon substrate 10. Moreover, in a cross-sectional view of amorphous silicon layer 20, the coverage of crystalline regions 213c in the valley portion 213 areas is greater than the coverage of amorphous regions 213a in the valley portion 213 areas.

Crystalline regions 213c are excellent in conductivity, as compared to the amorphous regions which are principal elements of amorphous silicon layer 20. Thus, the greater the coverage of the crystalline regions in amorphous silicon layer 20, the further the resistive losses are reduced and the fill factor (FF) is improved.

On the other hand, if the coverage of the crystalline regions in amorphous silicon layer 20 is increased, reduction of the open-circuit voltage (Voc) results. The crystalline regions grow starting from valley portions 213 of amorphous silicon layer 20. Thus, in order to optimize both the fill factor (FF) and the open-circuit voltage (Voc), it is important to optimize the coverage of the crystalline regions in valley portions 213 of amorphous silicon layer 20.

In a cross-sectional view of amorphous silicon layer 20 in photovoltaic device 1 according to the present embodiment, the coverage of crystalline regions 213c in the valley portion 213 areas is higher than the coverage of amorphous regions 213a in the valley portion 213 areas. This allows reduction of the resistive losses in amorphous silicon layer 20 and improvement of the fill factor (FF) of photovoltaic device 1, as compared to an amorphous silicon layer in which amorphous regions 213a are dominant in valley portions 213.

On the other hand, crystalline regions 213c in valley portions 213 grow in a pillar manner from the lower ends to the upper ends of valley portions 213, and are discretely present along the upper ends. Thus, amorphous regions 213a and crystalline regions 213c are scattered and mixed in valley portions 213. This allows reduction of the open-circuit voltage (Voc) of photovoltaic device 1 to be inhibited, while maintaining amorphous silicon layer 20 to a low resistance state, as compared to an amorphous silicon layer in which valley portions 213 are fully occupied with crystalline regions 213c as illustrated in Comparative Example described above. Thus, improvement of power generation efficiency of photovoltaic devices 1 is achieved.

While the embodiment has been described with reference to the crystalline structure, in valley portions 213 of amorphous silicon layer 20, having the characteristic feature as described above, it should be noted that the valley portions of amorphous silicon layer 40 may also have the same characteristic feature. To be more specific, the crystalline regions in the valley portions of amorphous silicon layer 40 may grow, in a pillar manner, approximately perpendicularly from the silicon substrate 10 side, and may be discretely present (in approximately X-axis direction) along the lower ends of the valley portions, the lower ends being opposite the upper ends of the valley portions, the upper ends being in contact with silicon substrate 10. Moreover, in a cross-sectional view of amorphous silicon layer 40, the coverage of the crystalline regions in the above valley portion area may be higher than the coverage of amorphous regions in the valley portion area.

This allows the fill factor (FF) to be improved, while inhibiting reduction of the open-circuit voltage (Voc), on both surface of silicon substrate 10.

Note that, preferably, in a cross-sectional view of photovoltaic device 1 according to the present embodiment, the coverage of crystalline regions 213c in the valley portion 213 areas of amorphous silicon layer 20 is higher than the coverage of crystalline regions in the valley portions of amorphous silicon layer 40. In other words, preferably, coverage of the crystalline regions in the valley portions of the amorphous silicon layer which has the same conductivity type as silicon substrate 10 is greater than the coverage of crystalline regions in the valley portions of the amorphous silicon layer which has a conductivity type opposite the conductivity type of silicon substrate 10.

In amorphous silicon layer 40 having a conductivity type different from the conductivity type of silicon substrate 10, carriers are effectively separated at the p-n junction which is an interface between amorphous silicon layer 40 and silicon substrate 10. Therefore, the importance of taking into account the resistive losses at the p-n junction is low. Thus, in view of the fact that a countermeasure for inhibiting the reduction of the open-circuit voltage (Voc) should be focused on, the coverage of the crystalline regions in the valley portions of amorphous silicon layer 40 may be small, as compared to amorphous silicon layer 20 that has the same conductivity type as silicon substrate 10.

Moreover, in view of the foregoing, amorphous silicon layer 40 which has a conductivity type different from the conductivity type of silicon substrate 10 may not have crystalline regions in the valley portions. This allows amorphous silicon layer 20 having the same conductivity type as silicon substrate 10 to improve the fill factor (FF) while inhibiting reduction of the open-circuit voltage (Voc), and amorphous silicon layer 40 having a conductivity type opposite the conductivity type of silicon substrate 10 to effectively inhibit reduction of the open-circuit voltage (Voc).

[4. Effects]

Photovoltaic devices 1 according to the present embodiment includes: silicon substrate 10 having a first major surface having a texture in which a plurality of pyramids are arrayed two-dimensionally; and amorphous silicon layer 20 on the first major surface of silicon substrate 10, amorphous silicon layer 20 having an uneven surface corresponding to the texture, wherein amorphous silicon layer 20: is amorphous in peak portions and slope portions 214 extending between the peak portions and valley portions 213 of the uneven surface; and has crystalline regions 213c which grow, in a pillar manner, approximately perpendicularly from a substrate surface of silicon substrate 10 in valley portions 213 of the uneven surface, the crystalline regions 213c being discretely present along upper ends of valley portions 213, the upper ends being opposite lower ends of valley portions 213, the lower ends being in contact with silicon substrate 10, wherein in a cross-sectional view of amorphous silicon layer 20, coverage of crystalline regions 213c in valley portions 213 is higher than coverage of amorphous regions 213a in valley portions 213.

According to this, in valley portions 213, the coverage of crystalline regions 213c is higher than the coverage of amorphous regions 213a, thereby reducing the resistive losses in amorphous silicon layer 20 and improving the fill factor (FF) of photovoltaic devices 1, as compared to an amorphous silicon layer in which amorphous regions 213a are dominant in valley portions 213.

On the other hand, crystalline regions 213c in valley portions 213 grow in a pillar manner from the lower ends to the upper ends of valley portions 213, and are discretely present along the upper ends. Thus, amorphous regions 213a and crystalline regions 213c are scattered and mixed in valley portions 213. This inhibits amorphous silicon layer 20 from changing to a low resistance state and inhibits reduction of the open-circuit voltage (Voc) of photovoltaic device 1, as compared to an amorphous silicon layer in which valley portions 213 are fully occupied with crystalline regions 213c.

Moreover, in a cross-sectional view of photovoltaic device 1, valley portions 213 may be radiused, each having a radius of curvature of 150 nm or less.

Moreover, in a cross-sectional view of photovoltaic device 1, valley portions 213 may be radiused and each lying between two pyramidal surfaces of silicon substrate 10, and an angle formed between two lines extending along the two pyramidal surfaces may be 60 degrees or less.

These configurations allow selective crystal growth in valley portions 213.

Moreover, first amorphous silicon layer 20 may have a conductivity type same as a conductivity type of silicon substrate 10.

This allows further reduction of the resistive losses in amorphous silicon layer 20 which has the same conductivity type as silicon substrate 10, thereby improving the fill factor (FF).

Moreover, amorphous silicon layer 20 may include: dielectric film 21 on the first major surface; and n-type amorphous silicon film 22 on dielectric film 21, the n-type amorphous silicon film 22 having a dopant which has a conductivity type same as the conductivity type of silicon substrate 10.

Moreover, silicon substrate 10 may further have a second major surface having the texture, the second major surface and the first major surface being opposing surfaces, photovoltaic devices 1 further including amorphous silicon layer 40 on the second major surface of silicon substrate 10, the amorphous silicon layer 40 having an uneven surface corresponding to the texture and having a conductivity type opposite the conductivity type of silicon substrate 10, wherein in cross-sectional views of amorphous silicon layers 20 and amorphous silicon layer 40, the coverage of the crystalline regions in the valley portions of amorphous silicon layers 20 may be higher than coverage of the crystalline regions in the valley portions of amorphous silicon layer 40.

In amorphous silicon layer 40 having a conductivity type different from the conductivity type of silicon substrate 10, carriers are effectively separated at the p-n junction which is an interface between amorphous silicon layer 40 and silicon substrate 10. Therefore, the importance of taking into account the resistive losses at the p-n junction is low. Thus, in view of the fact that a countermeasure for inhibiting the reduction of the open-circuit voltage (Voc) should be focused on, the coverage of the crystalline regions in the valley portions of amorphous silicon layer 40 may be reduced, as compared to amorphous silicon layer 20 that has the same conductivity type as silicon substrate 10. This allows amorphous silicon layer 20 having the same conductivity type as silicon substrate 10 to improve the fill factor (FF) while inhibiting reduction of the open-circuit voltage (Voc), and amorphous silicon layer 40 having a conductivity type opposite the conductivity type of silicon substrate 10 to effectively inhibit reduction of the open-circuit voltage (Voc).

Moreover, amorphous silicon layer 40 may include: dielectric film 41 on the second major surface; and p-type amorphous silicon film 42 on dielectric film 41, the p-type amorphous silicon film 42 having a dopant which has a conductivity type opposite the conductivity type of the silicon substrate.

Moreover, photovoltaic module 100 according to the present embodiment includes: photovoltaic devices 1 as described above that are disposed two-dimensionally; front surface shield 180A disposed on a front surface side of photovoltaic devices 1; rear surface shield 180B disposed on a rear surface side of photovoltaic devices 1; front surface filler 170A between front surface shield 180A and photovoltaic devices 1; and rear surface filler 170B between rear surface shield 180B and photovoltaic devices 1.

According to this, the open-circuit voltage (Voc) can be inhibited, while improving the fill factor (FF) of photovoltaic devices 1, thereby allowing improvement of power generation efficiency of the photovoltaic module.

Moreover, method for fabricating photovoltaic device 1 according to the present embodiment includes: etching a (100) plane of silicon substrate 10 to form, on a first major surface of silicon substrate 10, a texture in which a plurality of pyramids are two-dimensionally arrayed; after the (100) plane of silicon substrate 10 is etched, isotropically etching the first major surface of silicon substrate 10; after the first major surface of silicon substrate 10 is isotropically etched, surface treating the first major surface having the texture, by submerging the first major surface in a mixed solution of hydrofluoric acid and hydrogen peroxide; and forming, on the surface-treated first major surface, amorphous silicon layer 20 having an uneven surface corresponding to the texture, by vapor deposition using a raw material gas containing silicon.

According to this, crystalline regions 213c in valley portions 213 grow, in a pillar manner, approximately perpendicularly from the substrate surface of silicon substrate 10, and are discretely present (in approximately X-axis direction) along the upper ends of valley portions 213, the upper ends being opposite the lower ends of valley portions 213, the lower ends being in contact with silicon substrate 10. Moreover, the volume of crystalline regions 213c in valley portions 213 is increased greater than the volume of amorphous regions 213a in valley portions 213. Thus, reduction of the resistive losses in amorphous silicon layer 20 and improvement of the fill factor (FF) of photovoltaic devices 1 are achieved, and reduction of the open-circuit voltage (Voc) of photovoltaic devices 1 can also be inhibited.

Moreover, when the first major surface of silicon substrate 10 is isotropically etched, radiused recesses may be formed between the plurality of pyramids, when the first major surface is surface treated, front surfaces of the radiused recesses may be selectively surface treated, when amorphous silicon layer 20 is formed, crystalline regions 213c may be formed which grow, in a pillar manner, approximately perpendicularly from a substrate surface of silicon substrate 10 in valley portions 213 of the uneven surface, the crystalline regions 213c being discretely present along upper ends of valley portions 213, the upper ends being opposite lower ends of valley portions 213, the lower ends being in contact with silicon substrate 10, wherein in a cross-sectional view of amorphous silicon layer 20, coverage of crystalline regions 213c in valley portions 213 may be higher than coverage of amorphous regions 213a in valley portions 213.

Moreover, when the (100) plane of silicon substrate 10 is etched, a texture, in which the plurality of pyramids are two-dimensionally arrayed, may further be formed on a second major surface of silicon substrate 10, the first major surface and the second major surface being opposing surfaces, when the first major surface is isotropically etched, the second major surface may further be isotropically etched, when the first major surface is surface treated, the second major surface may further be surface treated by submerging the second major surface in the mixed solution containing hydrofluoric acid and hydrogen peroxide, when amorphous silicon layer 20 is formed on the surface-treated first major surface, amorphous silicon layer 20 having a conductivity type same as a conductivity type of silicon substrate 10 may be formed by vapor deposition using a raw material gas containing silicon and a dopant which has a conductivity type same as the conductivity type of silicon substrate 10, and amorphous silicon layer 40 having a conductivity type opposite the conductivity type of silicon substrate 10 may further be formed on the surface-treated second major surface by vapor deposition using a raw material gas containing silicon and a dopant having a conductivity type opposite the conductivity type of silicon substrate 10, wherein in cross-sectional views of amorphous silicon layer 20 and amorphous silicon layer 40, the coverage of the crystalline regions in valley portions 213v of amorphous silicon layer 20 may be higher than coverage of the crystalline regions in valley portions 213 of amorphous silicon layer 40.

According to this, reduction of the open-circuit voltage (Voc) is inhibited while the fill factor (FF) is improved by amorphous silicon layer 20 having the same conductivity type as silicon substrate 10, and reduction of the open-circuit voltage (Voc) is effectively inhibited by amorphous silicon layer 40 having a conductivity type opposite the conductivity type of silicon substrate 10.

Other Embodiments

Photovoltaic device 1, photovoltaic module 100, and the method for fabricating the photovoltaic device according to the present disclosure have been described with reference to the above embodiment. However, the present disclosure is not limited to the above embodiment.

For example, photovoltaic module 100 according to the embodiment has been described with reference to the configuration in which photovoltaic devices 1 are disposed in rows and columns on a plane. However, the present disclosure is not limited thereto. For example, photovoltaic devices 1 may be arranged in a ring configuration, in a one-dimensional straight line, or in a curved configuration.

In other instances, various modifications to the embodiment according to the present disclosure described above that may be conceived by a person skilled in the art and embodiments implemented in any combination of the components and functions shown in the embodiment are also included within the scope of the present disclosure, without departing from the spirit of the present disclosure.

What is claimed is:

1. A photovoltaic device, comprising:
   a silicon substrate having a first major surface having a texture in which a plurality of pyramids are arrayed two-dimensionally; and
   a first amorphous silicon layer on the first major surface of the silicon substrate, the first amorphous silicon layer having an uneven surface corresponding to the texture, wherein:
   the first amorphous silicon layer:
      is amorphous in peak portions and slope portions extending between the peak portions and valley portions of the uneven surface; and
      has crystalline regions which grow, in a pillar manner, approximately perpendicularly from a substrate surface of the silicon substrate in the valley portions of the uneven surface, the crystalline regions being discretely present along upper ends of the valley portions, the upper ends being opposite lower ends of the valley portions, the lower ends being in contact with the silicon substrate, and
      in a cross-sectional view of the first amorphous silicon layer, coverage of the crystalline regions in the valley portions is higher than coverage of amorphous regions in the valley portions.

2. The photovoltaic device according to claim 1, wherein in a cross-sectional view of the photovoltaic device, the valley portions are radiused, each having a radius of curvature of 150 nm or less.

3. The photovoltaic device according to claim 1, wherein in a cross-sectional view of the photovoltaic device, the valley portions are radiused and each lying between two pyramidal surfaces of the silicon substrate, and an angle formed between two lines extending along the two pyramidal surfaces is 60 degrees or less.

4. The photovoltaic device according to claim 1, wherein the first amorphous silicon layer has a conductivity type same as a conductivity type of the silicon substrate.

5. The photovoltaic device according to claim 4, wherein the first amorphous silicon layer includes:
   a first dielectric film on the first major surface; and
      a first amorphous silicon film on the first dielectric film, the first amorphous silicon film having a dopant which has a conductivity type same as the conductivity type of the silicon substrate.

6. The photovoltaic device according to claim 4, wherein:
the silicon substrate further has a second major surface having the texture, the second major surface and the first major surface being opposing surfaces,
the photovoltaic device further comprising
   a second amorphous silicon layer on the second major surface of the silicon substrate, the second amorphous silicon layer having an uneven surface corresponding to the texture and having a conductivity type opposite the conductivity type of the silicon substrate,
the second amorphous silicon layer has peak portions, valley portions and slope portions extending between the peak portions and the valley portions, and
in cross-sectional views of the first amorphous silicon layer and the second amorphous silicon layer, the coverage of the crystalline regions in the valley portions of the first amorphous silicon layer is higher than coverage of the crystalline regions in the valley portions of the second amorphous silicon layer.

7. The photovoltaic device according to claim 6, wherein the second amorphous silicon layer includes:
a second dielectric film on the second major surface; and
a second amorphous silicon film on the second dielectric film, the second amorphous silicon film having a dopant which has a conductivity type opposite the conductivity type of the silicon substrate.

8. A photovoltaic module, comprising:
a plurality of photovoltaic devices disposed two-dimensionally, each being the photovoltaic device according to claim 1;
a front surface shield disposed on a front surface side of the plurality of photovoltaic devices;
a rear surface shield disposed on a rear surface side of the plurality of photovoltaic devices;
a front surface filler between the front surface shield and the plurality of photovoltaic devices; and
a rear surface filler between the rear surface shield and the plurality of photovoltaic devices.

* * * * *